(12) United States Patent
Koike

(10) Patent No.: US 6,747,491 B1
(45) Date of Patent: Jun. 8, 2004

(54) SPIKE FREE CIRCUIT FOR REDUCING EMI EFFECT

(75) Inventor: Hideharu Koike, Yokohama (JP)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 10/410,173

(22) Filed: Apr. 10, 2003

(51) Int. Cl.[7] ............................................... H03L 7/00
(52) U.S. Cl. .......................... 327/141; 327/144; 327/34
(58) Field of Search ................................. 327/141, 144, 327/34, 198, 379, 386

(56) References Cited

U.S. PATENT DOCUMENTS 4,764,923 A * 8/1988 Forth et al. ................. 714/709
4,775,840 A * 10/1988 Ohmori et al. ............... 327/34
6,294,939 B1 * 9/2001 McClure ..................... 327/172

* cited by examiner

Primary Examiner—Tuan T. Lam
(74) Attorney, Agent, or Firm—Connolly, Bove, Lodge & Hutz LLP; Larry J. Hume

(57) ABSTRACT

The present invention discloses a spike free circuit, which comprises a first flip-flop stage, a time shift means, a group of logic gates and a second flip-flop stage. The first flip-flop stage is triggered by a first edge of a clock signal. The time shift means is electrically connected to the first flip-flop stage and triggered by a second edge opposite to the first edge of the clock signal. The time shift means shifts input signals, which change logic level within the first to the second edges of the clock signal one half cycle for preventing spike occurring. The group of logic gates is connected to the time shift means. The second flip-flop stage is electrically connected to the group of logic gates and triggered by the first edge of the clock signal.

11 Claims, 6 Drawing Sheets

SPIKE FREE CIRCUIT FOR REDUCING EMI EFFECT

BACKGROUND OF THE INVENTION

1. Field of the Invention

The present invention relates to a synchronous circuit, particularly to a logic circuit with low EMI (Electro Magnetic Interference) effect by erasing spikes among internal gates.

2. Description of Related Art

The synchronous circuit has been widely used in VLSI or ULSI designs due to fast speed, simple design methodology and ease to be handled by CAD tools. However, a synchronous circuit has some problems in nature, such as clock skew and racing problem, big switching current, big power consumption and spikes among internal logic gates. The occurrence of spikes among internal logic gates is usually caused when two input signals change to opposite logic levels with a small time gap. In most situations, the spike of internal gates will induce EMI effect, which is proportional to $$\frac{1}{T^2},$$

wherein T represents the width of the spikes.

Please refer to FIG. 1, which shows a logic circuit having a first flip-flop stage 11, a group of logic gates 12 and a second flip-flop stage 13. For synchronous purpose, the flip-flops 111, 112 and 113 in the first flip-flop stage 11 and the flip-flops 131 in the second flip-flop stage 13 are designed in the same manner of positive edge triggered. The inputs of the NAND gate 121 are connected to the outputs A and ~B of the flip-flops 111 and 112. The inputs of the NAND gate 122 are connected to the output D of the NAND gate 121 and the output B of the flip-flop 112. The inputs of the NOR gate 123 are connected to the output E of the NAND gate 122 and the output C of the flip-flop 113. Finally, the output F of the NOR gate 123 acts as the input of the flip-flop 131.

FIG. 2 shows a timing diagram of the logic circuit in FIG. 1. It is found that the signal C changes logic level from high to low on the rising edge of the clock signal (denoted as CK in FIG. 2) but the other input E of the NOR gate 123 changes logic level from low to high after a time difference from the rising edge of the clock signal. The difference results in a spike appearing in the signal F, and the spike will induce an EMI effect.

In other words, the prior art circuit will generate spikes among internal gates if their inputs change their logic levels in opposite directions and at different time. In order to solve the above problem, the present invention proposes a novelty spike free circuit with low EMI effect.

SUMMARY OF THE INVENTION

The main object of the present invention is to provide a spike free circuit meeting the demand of low EMI effect.

The second object of the present invention is to provide a spike free logic circuit, which can avoid unknown states occurring in a simulation environment.

To obtain the above purposes, the spike free circuit of the present invention comprises a first flip-flop stage, a time shift means, a group of logic gates and a second flip-flop stage. The first flip-flop stage is triggered by a first edge of a clock signal. The time shift means is electrically connected to the first flip-flop stage and triggered by a second edge opposite to the first edge of the clock signal. The time shift means shifts input signals, which changes logic level within the first to the second edges of the clock signal one half cycle for preventing spike occurring. The group of logic gates is connected to the time shift means. The second flip-flop stage is electrically connected to the group of logic gates and triggered by the first edge of the clock signal. The first edge of the clock signal can be selected from the rising or falling edges of the clock signal. The second edge of the clock signal, as defined above, is the one not being selected.

BRIEF DESCRIPTION OF THE DRAWINGS

The present invention will be described according to the appended drawings in which.

PREFERRED EMBODIMENT OF THE PRESENT INVENTION

Figure 1:
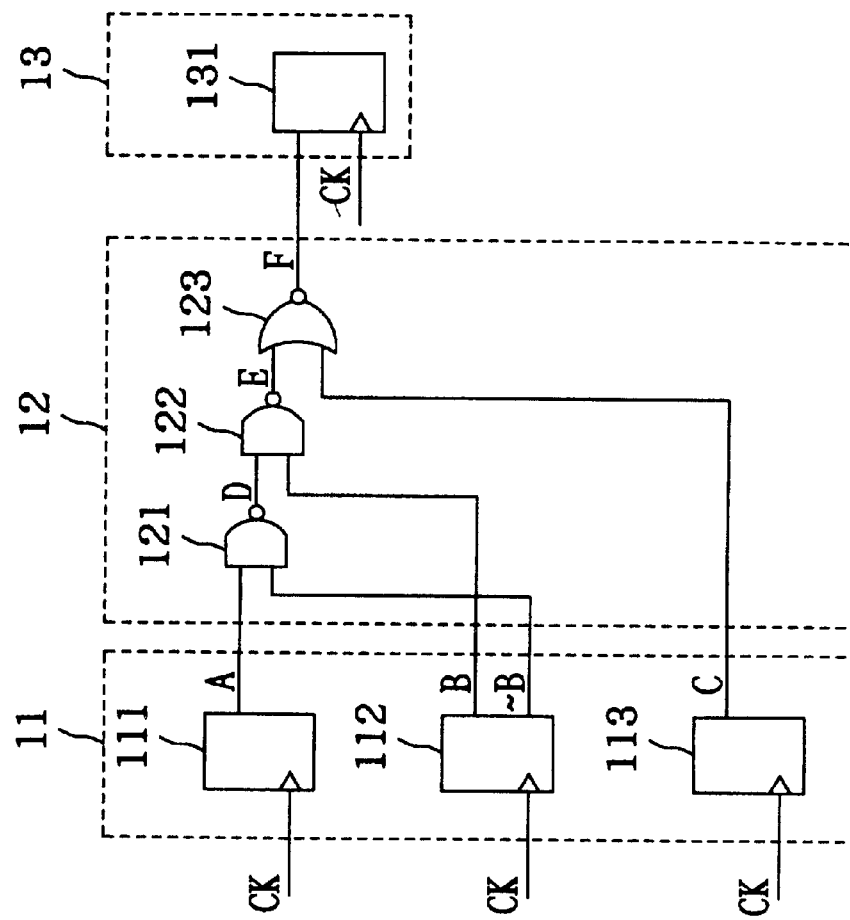
FIG. 1 shows a prior art logic circuit.
Figure 2:
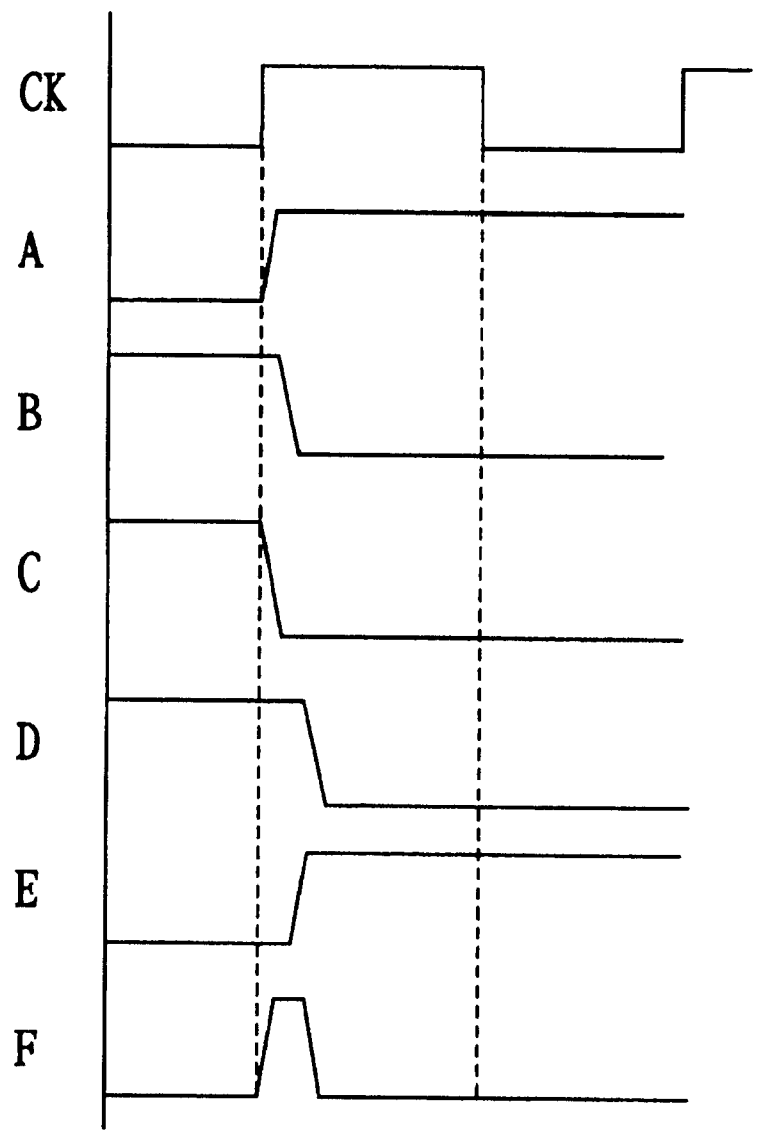
FIG. 2 shows the timing diagram of the logic circuit in FIG. 1.
Figure 3:
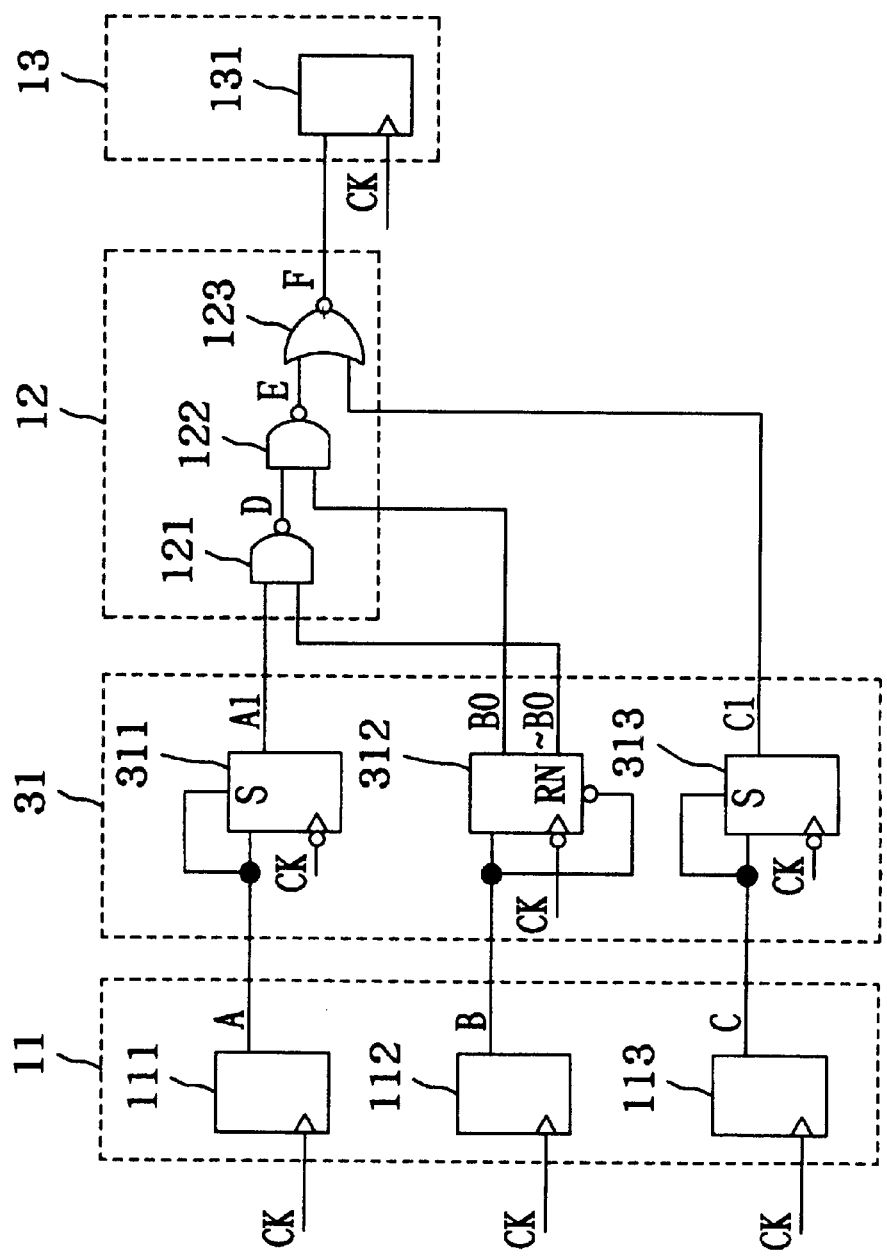
FIG. 3 shows a spike free circuit of a first embodiment according to the present invention.

FIG. 3 shows a spike free circuit of a first embodiment according to the present invention. The difference from the prior art circuit shown in FIG. 1 is that the present invention appends a time shift means 31 within the first flip-flop stage 11 and the group of the logic gates 12. The first data latches 311 and 313 (flip-flops can be another choice) and the second data latch 312 (a flip-flop can be another choice) in the time shift means 31 are triggered by negative edges of the clock signal. The input signal of the first data latch 311 is further connected to the preset terminal (denoted as S in the data latch), which means that when the clock signal is in positive level, the output A1 exhibits logic high if the input A is logic high at this moment or the input A is logic high at previous cycle but is logic low at this moment. The input signal of the second data latch 312 is further connected to the reset terminal (denoted as RN in the data latch), which means that when the clock signal is in negative level, the output B0 exhibits logic low if the input B is logic low at this moment or the input B is logic low at previous cycle but is logic high at this moment. The input signal of the data latch 313 is further connected to its preset terminal, which means that when the clock signal is in positive level, the output C1 exhibits logic high if the input C is logic high at this moment or the input C is logic high at previous cycle but is logic low at this moment. The selection of connecting the input signal to the preset or reset terminals is dependent upon to which types of the gates the data latches are connected. If the logic gate to which the data latches outputs is an AND or NAND gate, the connection from the input signal to a reset terminal is selected. If the logic gate the data latches outputs to is an OR or NOR gate, the connection from the input signal to the preset terminal is selected.

Figure 4:
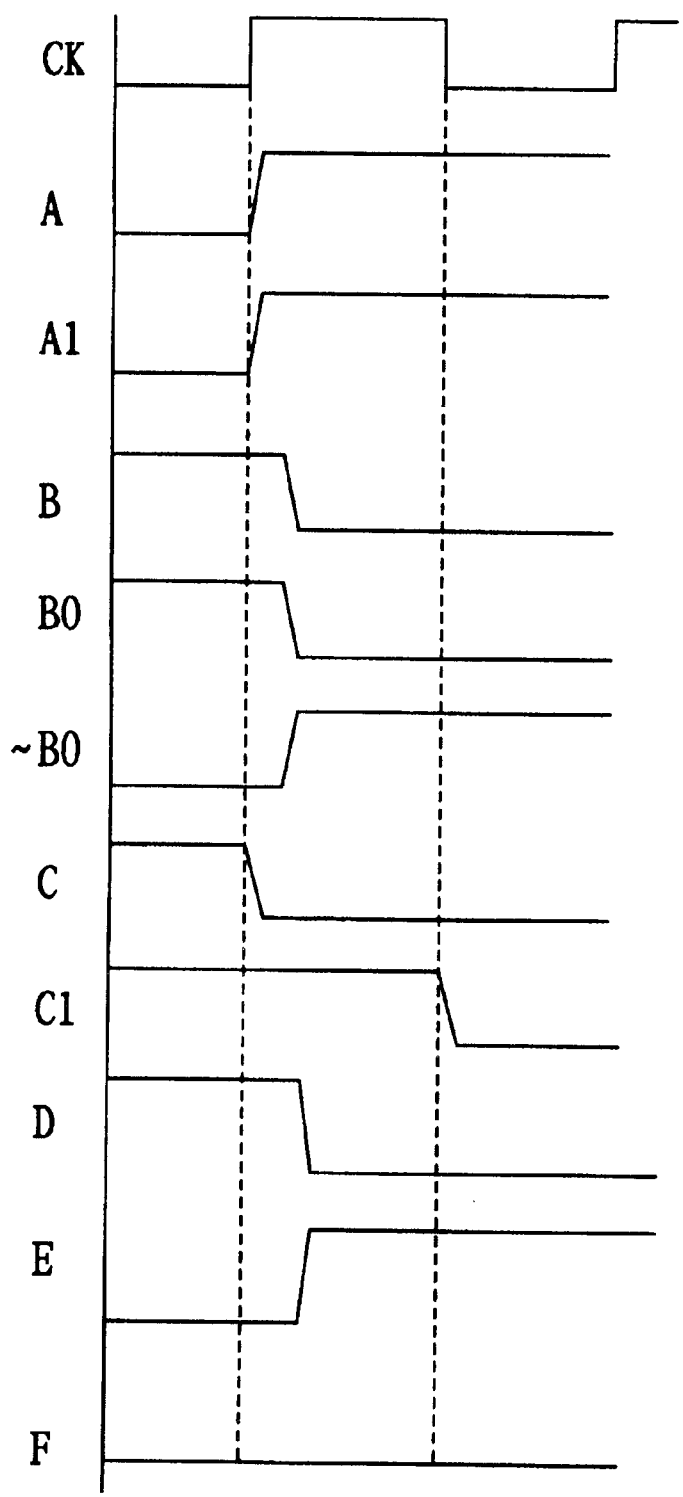
FIG. 4 shows the timing diagram of the logic circuit in FIG. 3.

FIG. 4 shows the timing diagram of the logic circuit in FIG. 3. It is apparent that the spike shown in signal F of FIG.

2 disappears, and the result also eliminates prior EMI effect. In other words, the first data latch 313 of the time shift means 31 will shift the falling of the signal C1 one half cycle for preventing logic level variation of signal C1 in the positive level of the clock signal. Therefore, even the signal E changes its logic level from low to high with a time gap from that of the signal C, the spike will not occur.

Figure 5A:
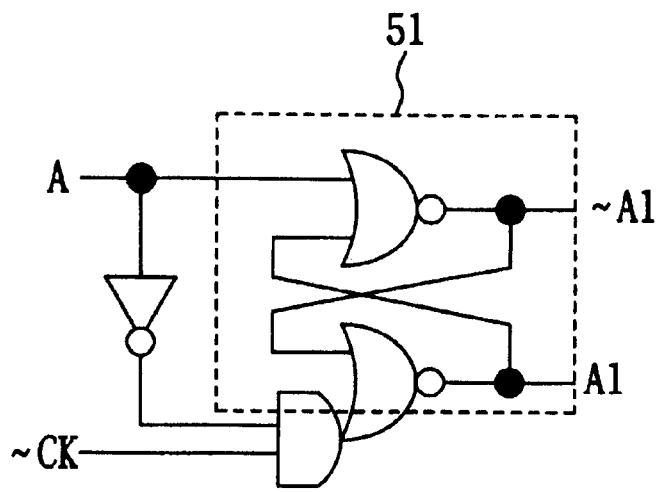
FIGS. 5(a) and 5(b) show circuit diagrams of the time shift means of a second embodiment according to the present invention.
Figure 5B:
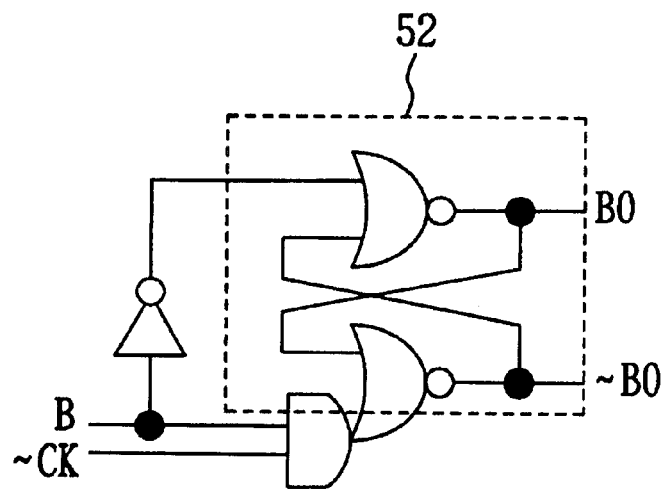

FIGS. 5(a) and 5(b) show circuit diagrams of the time shift means of a second embodiment according to the present invention. FIG. 5(a) shows a possible implementation of the first data latches 311 and 313, which include a clock-controlling latch 51. When the clock signal is at negative level, the clock-controlling latch 51 exhibits like a normal buffer. However, when the clock signal is at positive level, the output A1 exhibits logic high if the input A is logic high at this moment or the input A is logic high at previous cycle but is logic low at this moment. FIG. 5(b) shows a possible implementation of the second data latch 312, which includes another clock-controlling latch 52. When the clock signal is at negative level, the clock-controlling latch 52 exhibits like a normal buffer. However, when the clock signal at positive level, the output B0 exhibits logic low if the input B is logic low at this moment or the input B is logic low at previous cycle but is logic high at this moment.

Figure 6A:
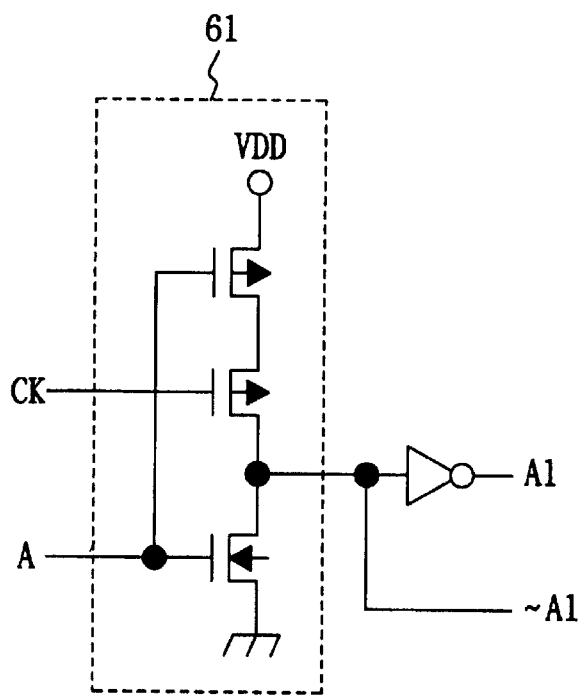
FIGS. 6(a) and 6(b) show circuit diagrams of the time shift means of a third embodiment according to the present invention.
Figure 6B:
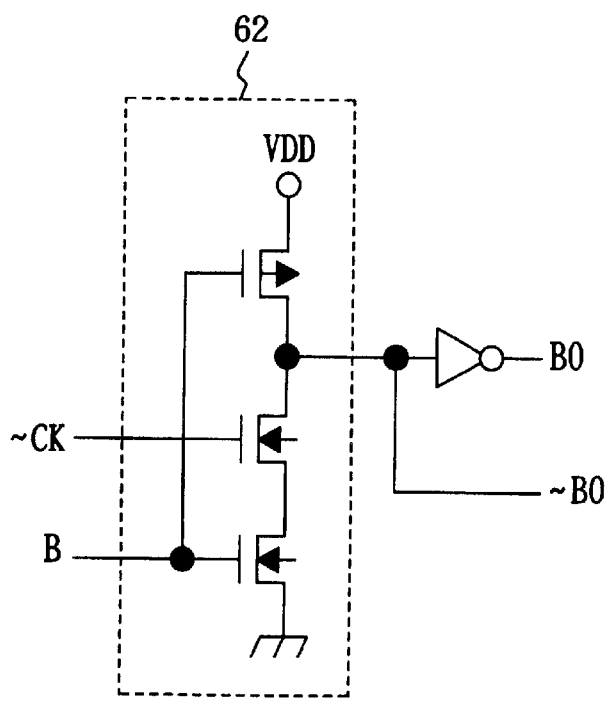

FIGS. 6(a) and 6(b) show circuit diagrams of the time shift means of a third embodiment according to the present invention. FIG. 6(a) shows a possible implementation of the first data latches 311 and 313, which include a clock-controlling CMOS circuit (also called as $C^2MOS$) 61. When the clock signal is at negative level, the clock-controlling CMOS circuit 61 exhibits like a normal buffer. However, when the clock signal is at positive level, the output A1 exhibits logic high if the input A is logic high at this moment or the input A is logic high at previous cycle but is logic low at this moment due to the charge reservation of stray capacitances. FIG. 6(b) shows a possible implementation of the second data latch 312, which include another clock-controlling CMOS circuit (also called $C^2MOS$) 62. When the clock signal is at negative level, the clock-controlling CMOS circuit 62 exhibits like a normal buffer. However, when the clock signal is at positive level, the output B0 exhibits logic low if the input B is logic low at this moment or the input B is logic low at previous cycle but is logic high at this moment due to the charge reservation of stray capacitances.

Another merit of the present invention is that the simulation screen will be easier to read. In most cases, if an unknown state caused by a spike exists in the simulation environment, it will propagate to the gates it connects to, make all the simulation waveforms difficult to read and make the designer fail to locate the original position of the spike. The present invention can avoid the spikes from occurring, and provide a clear simulation environment for engineers to debug their circuit design.

The above-described embodiments of the present invention are intended to be illustrative only. Numerous alternative embodiments may be devised by those skilled in the art without departing from the scope of the following claims.

What is claimed is:

1. A spike free circuit, comprising:
   a first flip-flop stage triggered by a first edge of a clock signal; and
   a time shift means electrically connected to the first flip-flop stage and triggered by a second edge opposite to the first edge of the clock signal, the time shift means shifting input signals which changes logic level within the first to the second edges of the clock signal one half cycle for preventing spike occurring;
   a group of logic gates connected to the time shift means; and
   a second flip-flop stage electrically connected to the group of logic gates and triggered by the first edge of the clock signal.

2. The spike free circuit of claim 1, wherein the time shift means includes a first flip-flop outputting a logic high within the first to the second edges of the clock signal when the input signal of the time shift means is logic high prior to the first edge of the clock signal.

3. The spike free circuit of claim 1, wherein the time shift means includes a first data latch outputting a logic high within the first to the second edges of the clock signal when the input signal of the time shift means is logic high prior to the first edge of the clock signal.

4. The spike free circuit of claim 1, wherein the time shift means includes a first flip-flop outputting a logic low within the first to the second edges of the clock signal when the input signal of the time shift means is logic low prior to the first edge of the clock signal.

5. The spike free circuit of claim 1, wherein the time shift means includes a first data latch outputting a logic low within the first to the second edges of the clock signal when the input signal of the time shift means is logic low prior to the first edge of the clock signal.

6. The spike free circuit of claim 3, wherein the first data latch is connected to an OR gate or NOR gate of the group of logic gates.

7. The spike free circuit of claim 5, wherein the first data latch is connected to an AND gate or NAND gate of the group of logic gates.

8. The spike free circuit of claim 3, wherein the first data latch functions like a data latch with a connection between its input and preset terminal.

9. The spike free circuit of claim 5, wherein the first data latch functions like a data latch with a connection between its input and reset terminal.

10. The spike free circuit of claim 1, wherein the time shift means includes a clock-controlling latch.

11. The spike free circuit of claim 1, wherein the time shift means includes a clock-controlling CMOS circuit.

* * * * *